(12) United States Patent
Bang et al.

(10) Patent No.: US 11,456,348 B2
(45) Date of Patent: Sep. 27, 2022

(54) DISPLAY DEVICE

(71) Applicant: Samsung Display Co., Ltd., Yongin-si (KR)

(72) Inventors: Ki Ho Bang, Yongin-si (KR); Eun Hye Kim, Yongin-si (KR); Eun Ae Jung, Yongin-si (KR); Won Suk Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 37 days.

(21) Appl. No.: 16/838,033

(22) Filed: Apr. 2, 2020

(65) Prior Publication Data
US 2021/0005696 A1 Jan. 7, 2021

(30) Foreign Application Priority Data

Jul. 2, 2019 (KR) .......................... 10-2019-0079671

(51) Int. Cl.
*H01L 27/32* (2006.01)
*H01L 51/52* (2006.01)
*H01L 51/56* (2006.01)

(52) U.S. Cl.
CPC ...... *H01L 27/3276* (2013.01); *H01L 27/3246* (2013.01); *H01L 27/3262* (2013.01); *H01L 51/5253* (2013.01); *H01L 51/56* (2013.01)

(58) Field of Classification Search
CPC ........... H01L 27/14678; H01L 27/3276; H01L 27/3246; H01L 27/3262; H01L 27/323; H01L 27/3248; H01L 27/3279; H01L 27/3272; H01L 27/3258; H01L 27/3244; H01L 51/5253; H01L 51/5237; H01L 51/5203

See application file for complete search history.

(56) References Cited

U.S. PATENT DOCUMENTS

| 10,268,296 | B2* | 4/2019 | Choi | H01L 51/0097 |
| 10,340,317 | B2* | 7/2019 | Oh | H01L 51/5246 |
| 10,916,616 | B2* | 2/2021 | Lee | H01L 27/3262 |
| 2015/0036300 | A1* | 2/2015 | Park | H05K 1/147 156/212 |
| 2017/0090661 | A1* | 3/2017 | Kim | G06F 3/04164 |

(Continued)

FOREIGN PATENT DOCUMENTS

KR 10-2018-0124326 11/2018

*Primary Examiner* — Mary A Wilczewski
*Assistant Examiner* — Tsz K Chiu
(74) *Attorney, Agent, or Firm* — H.C. Park & Associates, PLC

(57) ABSTRACT

A display device includes a substrate, a pixel, an encapsulation film, a sensing electrode, a pad, a connection wire, and an extension pattern. The substrate include a display area, a non-display area outside the display area, an additional area at a side of the non-display area, and a bending area defined in at least a portion of the additional area. The pixel is on the display area. The encapsulation film is on the pixel. The sensing electrode is on the encapsulation film. The pad is on the additional area. The connection wire is on the non-display area and is directly connected to the sensing electrode. The extension pattern directly connects the pad and the connection wire to each other. The extension pattern traverses the bending area.

20 Claims, 10 Drawing Sheets

(56) References Cited

U.S. PATENT DOCUMENTS

| | | | |
|---|---|---|---|
| 2017/0237025 A1* | 8/2017 | Choi | H01L 51/5256 |
| | | | 257/40 |
| 2017/0262109 A1* | 9/2017 | Choi | H01L 51/0097 |
| 2017/0277288 A1* | 9/2017 | Choi | H01L 51/5253 |
| 2017/0315645 A1* | 11/2017 | Park | H01L 27/323 |
| 2018/0033831 A1 | 2/2018 | An et al. | |
| 2018/0033832 A1* | 2/2018 | Park | G06F 3/0446 |
| 2018/0090702 A1* | 3/2018 | Um | H01L 51/5253 |
| 2018/0151662 A1* | 5/2018 | Rhe | H01L 27/323 |
| 2018/0188838 A1* | 7/2018 | An | G06F 3/0412 |
| 2018/0329552 A1 | 11/2018 | Song et al. | |
| 2018/0337223 A1* | 11/2018 | Lee | H01L 27/1218 |
| 2018/0348930 A1* | 12/2018 | Lee | G06F 3/047 |
| 2018/0350884 A1* | 12/2018 | Won | H01L 51/5221 |
| 2019/0019966 A1* | 1/2019 | Jiang | H01L 27/3276 |
| 2019/0064958 A1* | 2/2019 | Liu | G06F 3/0446 |
| 2019/0095007 A1* | 3/2019 | Jeong | H01L 27/3246 |
| 2019/0171322 A1* | 6/2019 | Zhai | G02F 1/133345 |
| 2020/0379595 A1* | 12/2020 | Kim | G09G 3/03 |
| 2021/0005696 A1* | 1/2021 | Bang | H01L 51/5253 |
| 2021/0020856 A1* | 1/2021 | Kwon | G06F 3/044 |
| 2021/0091144 A1* | 3/2021 | Won | H01L 27/3258 |

\* cited by examiner

DISPLAY DEVICE

CROSS-REFERENCE TO RELATED APPLICATION

This application claims priority to and the benefit of Korean Patent Application No. 10-2019-0079671, filed Jul. 2, 2019, which is hereby incorporated by reference for all purposes as if fully set forth herein.

BACKGROUND

Field

Exemplary embodiments generally relate to a display device.

Discussion

As information technology is developed, the importance of a display device, which is a connection medium between a user and information, is emphasized. Accordingly, use of a display device, such as an organic light emitting display device, a liquid crystal display device, a plasma display device, etc., has been increasing. Further, for aesthetic impression and various user experiences, demand for bended displays has been increasing. In addition, demand for a bezel-less (or at least reduced bezel size) display, which has a reduced thickness of a bezel has been increasing. That being said, a driving signal and a sensing signal may be transmitted to and received from a touch electrode through a wire (or transmission line) to determine the presence or absence of a touch input (or interaction) and coordinates of the touch input. The wire may be included in a non-display area, such as a bezel area. Further, the wire is typically electrically connected to a pad. In some display devices, a bridge wire is used to electrically connect the wire and the pad.

The above information disclosed in this section is only for understanding the background of the inventive concepts, and, therefore, may contain information that does not form prior art.

SUMMARY

Some aspects provide a display device capable of reducing a dead space without using a bridge wire.

Additional aspects will be set forth in the detailed description which follows, and, in part, will be apparent from the disclosure, or may be learned by practice of the inventive concepts.

According to some aspects, a display device includes a substrate, a pixel, an encapsulation film, a sensing electrode, a pad, a connection wire, and an extension pattern. The substrate include a display area, a non-display area outside the display area, an additional area at a side of the non-display area, and a bending area defined in at least a portion of the additional area. The pixel is on the display area. The encapsulation film is on the pixel. The sensing electrode is on the encapsulation film. The pad is on the additional area. The connection wire is on the non-display area and is directly connected to the sensing electrode. The extension pattern directly connects the pad and the connection wire to each other. The extension pattern traverses the bending area.

According to some aspects, a display device includes a substrate, a transistor, a light emitting element, an encapsulation film, a sensing electrode, a pad, and a connection wire. The substrate include a display area, a non-display area outside the display area, an additional area on a side of the non-display area, and a bending area defined in at least a portion of the additional area. The transistor is on the display area. The light emitting element includes an anode electrically connected to the transistor. The encapsulation film covers the light emitting element. The sensing electrode is on the encapsulation film. The pad is on the additional area. The connection wire is on the non-display area and is directly connected to the sensing electrode. The connection wire is directly connected to the pad and overlaps the non-display area and the bending area.

According to various aspects, a display device may increase electrical connection reliability between a touch wire and a pad, and may reduce a dead space.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF SOME EXEMPLARY EMBODIMENTS

Figure 1:
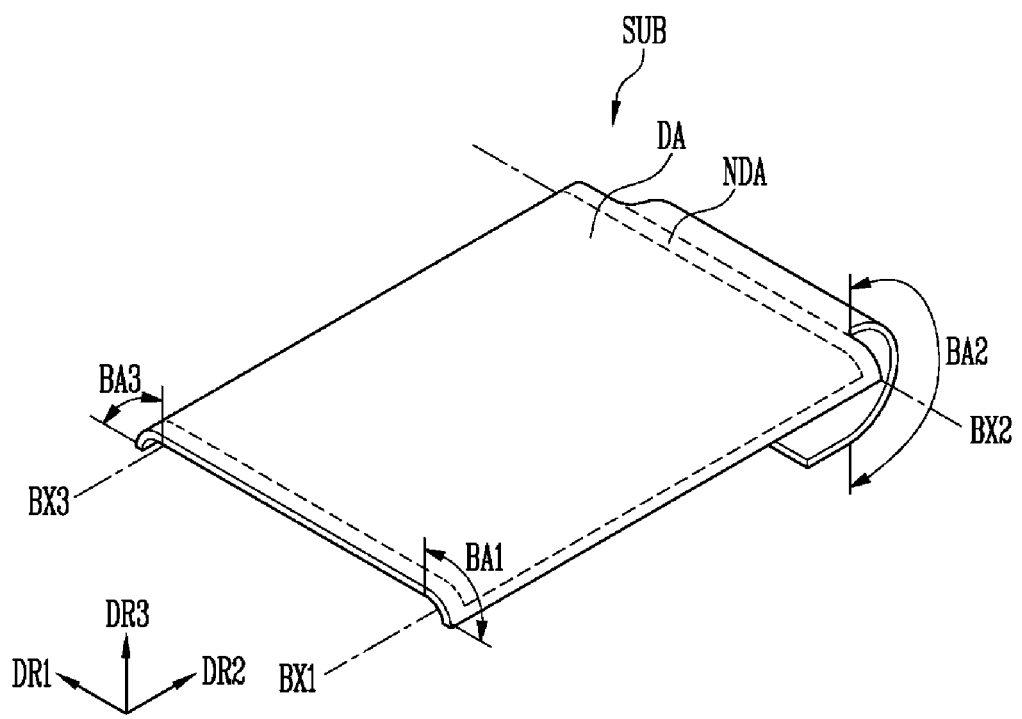
FIG. 1 is a diagram for describing a substrate according to an exemplary embodiment.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

Figure 2:
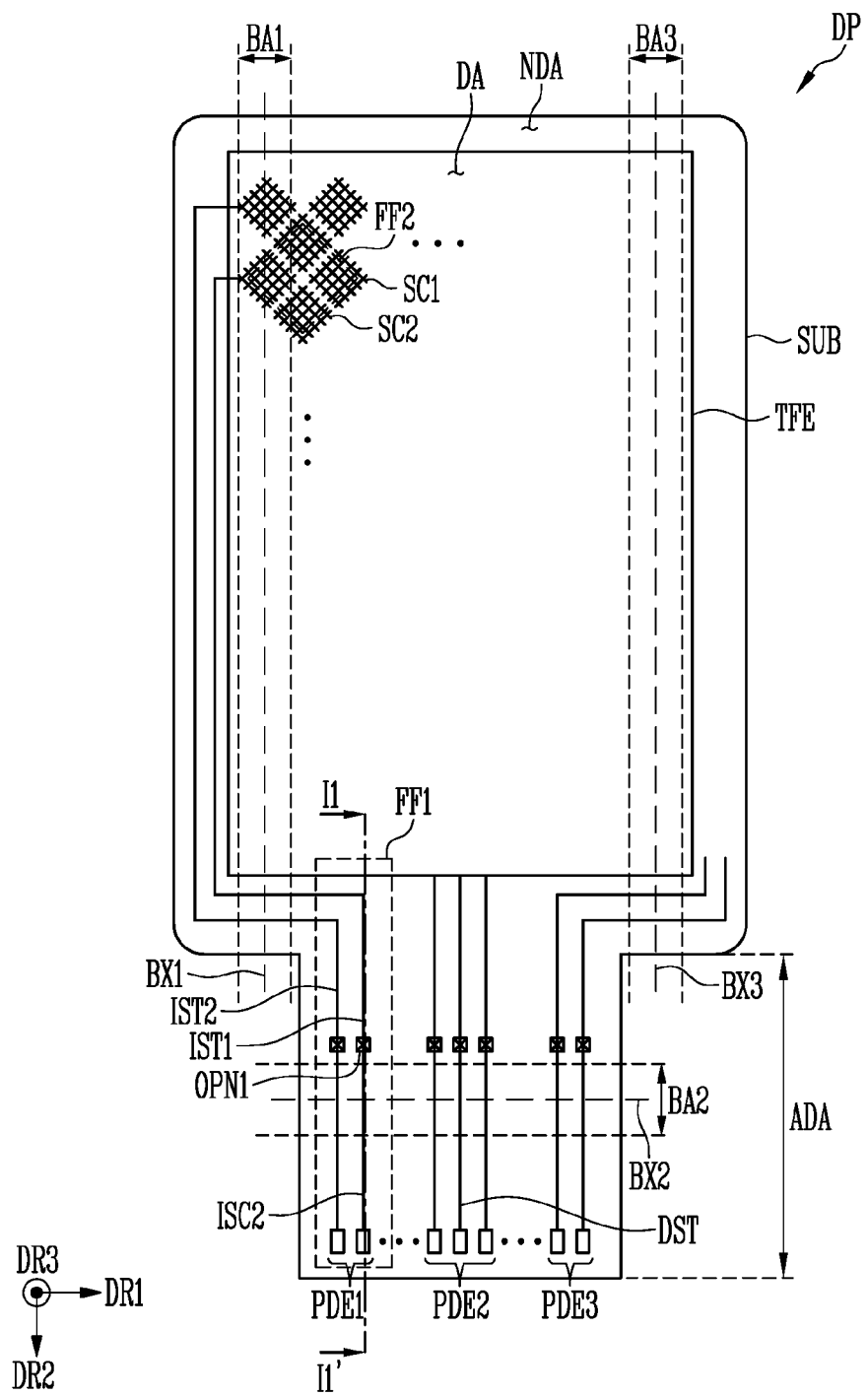
FIG. 2 is a diagram for describing a display device according to an exemplary embodiment.

FIG. 1 is a diagram for describing a substrate according to an exemplary embodiment. FIG. 2 is a diagram for describing a display device according to an exemplary embodiment.

Hereinafter, an organic light emitting diode display will be described as an example of a display device DP. However, exemplary embodiments are not limited thereto and may be applied to other display devices, such as a liquid crystal display, a plasma display, a field emission display, an electrophoretic display, an electrowetting display, a quantum dot light emitting display, micro light emitting diode (LED) display, and the like.

In an exemplary embodiment, a plane may define a position in a first direction DR1 and a second direction DR2, and a height may define a position in a third direction DR3. The first direction DR1, the second direction DR2, and the third direction DR3 may be understood as relative directions orthogonal to each other.

Referring to FIGS. 1 and 2, the substrate SUB may include a display area DA, a non-display area NDA, an additional area ADA.

As an exemplary embodiment, the display area DA may have a rectangular shape. Each corner of the display area DA may be an angular shape or a curved shape, but any other configuration may be utilized. In addition, in a case of a circular display, a shape of the display area DA may have a circular shape. It is also contemplated that the shape of the display area DA may be configured as a polygon other than a quadrangle, an ellipse, or the like. As described above, a shape of the display area DA may be set differently depending on a product.

Pixels (not shown) including a transistor and a light emitting element may be positioned on the display area DA. A type of the light emitting element included in each pixel may be different according to a type of the display device DP. For example, the light emitting element may be an organic light emitting diode.

The non-display area NDA may be outside the display area DA, e.g., may surround an outer periphery of the display area DA. For example, the non-display area NDA may have a rectangular shape. Each corner of the non-display area NDA may be an angular shape or a curved shape. FIG. 2 shows a case in which each corner of the non-display area NDA has the curved shape. The non-display area NDA may have a circular shape. Since minimizing the non-display area NDA may be advantageous to a narrow bezel structure, a shape of the non-display area NDA may be similar to a shape of an edge of the display area DA.

According to an exemplary embodiment, the additional area ADA may be positioned on (or at) one side of the non-display area NDA and may have a rectangular shape. Each corner positioned in the second direction DR2 of the additional area ADA may be an angular shape or a curved shape. FIG. 2 shows a case in which each corner positioned in the second direction DR2 of the additional area ADA is the angular shape. At least a portion of the additional area ADA may be a bent area.

As described above, the display area DA, the non-display area NDA, and the additional area ADA are not limited to the shown shapes, and may have various shapes according to an exemplary embodiment.

An encapsulation film TFE may be positioned on the pixels. For example, the encapsulation film (or layer) TFE may cover the pixels in the display area DA and a boundary of the encapsulation film TFE may be positioned in the non-display area NDA. The encapsulation film TFE may cover the light emitting elements and the circuit elements of the pixels of the display area DA, thereby preventing (or mitigating) breakage from external moisture or impact.

Sensing electrodes SC1 and SC2 may be positioned on the encapsulation film TFE. The sensing electrodes SC1 and SC2 may sense various touch interactions, such as a touch, a hovering, a gesture, a proximity, and the like, by a portion (e.g., body) of a user, a stylus, and/or the like. The sensing electrodes SC1 and SC2 may be configured in different shapes or configurations according to various methods, such as a resistive type sensor, a capacitive type sensor, an electro-magnetic (EM) type sensor, an optical type sensor, etc. For example, when the sensing electrodes SC1 and SC2 are configured of the capacitive type, the sensing electrodes SC1 and SC2 may be configured of a self-capacitive type, a mutual-capacitive type, or the like.

When the sensing electrodes SC1 and SC2 are configured of the self-capacitive type, each of the sensing electrodes SC1 and SC2 may be independently driven, and sensing signals corresponding to capacitances formed by the each of the sensing electrodes SC1 and SC2 and the portion of the user may be provided to corresponding connection wires IST1 and IST2.

When the sensing electrodes SC1 and SC2 are configured of the mutual-capacitive type, a sensing signal may be received through a connection wire corresponding to the first sensing electrode SC1, and a driving signal may be transmitted through a connection wire corresponding to the second sensing electrode SC2 forming a mutual capacitance with the first sensing electrode SC1. Although not clearly shown, each of the sensing electrodes SC1 and SC2 positioned on (or near) the outside, e.g., boarder region) may be directly connected to the corresponding connection wire. When the portion of the user approaches, the mutual capacitance between the first sensing electrode SC1 and the second sensing electrode SC2 may be changed, and thus, the touch of the user may be detected in accordance with a difference of the sensing signal according to the change of the mutual capacitance.

Pads PDE1, PDE2, and PDE3 may be positioned on the additional area ADA. The pads PDE1 and PDE3 may be electrically connected to the sensing electrodes SC1 and SC2 positioned above the encapsulation film TFE through the connection wires IST1 and IST2. Some pads PDE1 and PDE3 may be connected to an external touch integrated chip ("IC"). In addition, some other pads PDE2 may be connected to the pixels positioned under the encapsulation film TFE or a driver of the pixels through display wires DST. The driver may include a scan driver, a light emitting driver, a data driver, and/or the like. The driver may be positioned under the encapsulation film TFE or may be positioned in (or on) an external display IC connected through the pads PDE2.

When the display device DP is the self-capacitive type, there may be no difference in a transmission and reception method of the sensing electrodes SC1 and SC2.

The display wires DST may include a control line, a data line, a power line, and/or the like, and may provide signals so that the pixels may display an image. The signals may be provided from the driver connected to the display wires DST.

FIG. 1 shows a state in which the substrate SUB is bent, and FIG. 2 shows a state in which the substrate SUB is unbent. The display device DP may be bent as shown in FIG. 1 after elements are stacked on the substrate SUB in a state in which the display device DP is unbent as shown in FIG. 2.

The display area DA and the non-display area NDA may include a first bending area BA1 in some areas. The first bending area BA1 may have a width in the first direction DR1 and a length extending in the second direction DR2. A first bending axis BX1 may be defined as a folding line extending in the second direction DR2 from a center of the first bending area BA1. According to an exemplary embodiment, the first bending area BA1 may be a portion where stress is reduced due to removal of a portion of an insulating film or the like, differently from other portions around the first bending area BA1. According to an exemplary embodiment, the first bending area BA1 may have the same configuration as the other portions around first bending area BA1.

The display area DA and the non-display area NDA may include a third bending area BA3 in some other areas. The third bending area BA3 may have a width in the first direction DR1 and a length extending in the second direction DR2. A third bending axis BX3 may be defined as a folding line extending in the second direction DR2 from a center of the third bending area BA3. According to an exemplary embodiment, the third bending area BA3 may be a portion where stress is reduced by removal of a portion of the insulating film or the like, differently from the other portions around the third bending area BA3. According to an exemplary embodiment, the third bending area BA3 may have the same configuration as the other portions around the third bending area BA3.

The additional area ADA may include a second bending area BA2 defined as an area that may be folded at least in some areas. As an exemplary embodiment, the second bending area BA2 may have a width in the second direction DR2 and a length extending in the first direction DR1. A second bending axis BX2 may be defined as a folding line extending in the first direction DR1 from a center of the second bending area BA2. According to an exemplary embodiment, the second bending area BA2 may be a portion where stress is reduced due to removal of a portion of the insulating film or the like, differently from other portions around the second bending area BA2. According to an exemplary embodiment, the second bending area BA2 may have the same configuration as the other portions around the second bending area BA2.

As an exemplary embodiment, the first to third bending areas BA1, BA2, and BA3 may not overlap with each other. For the purposes of this disclosure, the term "overlap" means that two configurations overlap with each other in a thickness direction (i.e., in the third direction DR3) of the display device DP, unless otherwise defined.

Here, the term "folded" means that a shape is not fixed and may be modified from its original form to another form, and may mean being folded, curved, or rolled along one or more bending axes. A side bezel width of the first direction DR1 and a direction opposite to the first direction DR1 of the display device DP may be reduced by the first and third bending areas BA1 and BA3. In addition, a side bezel width of the second direction DR2 of the display device DP may be reduced by the second bending area BA2.

Hereinafter, a cross-section of the display device DP will be described with reference to at least FIG. 3.

Figure 3:
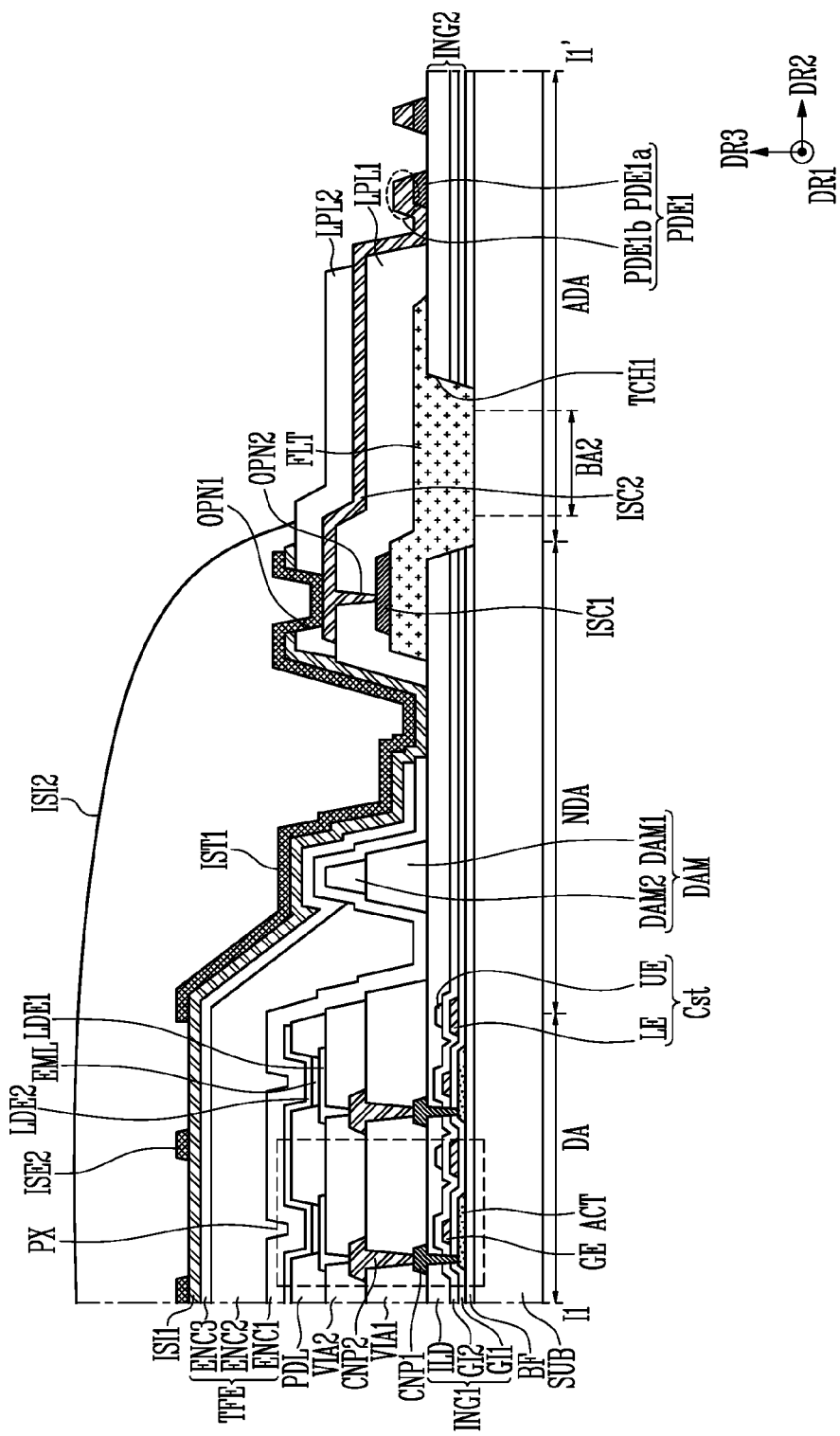
FIG. 3 is a cross-sectional view taken along sectional line of FIG. 2 according to an exemplary embodiment.
Figure 4:
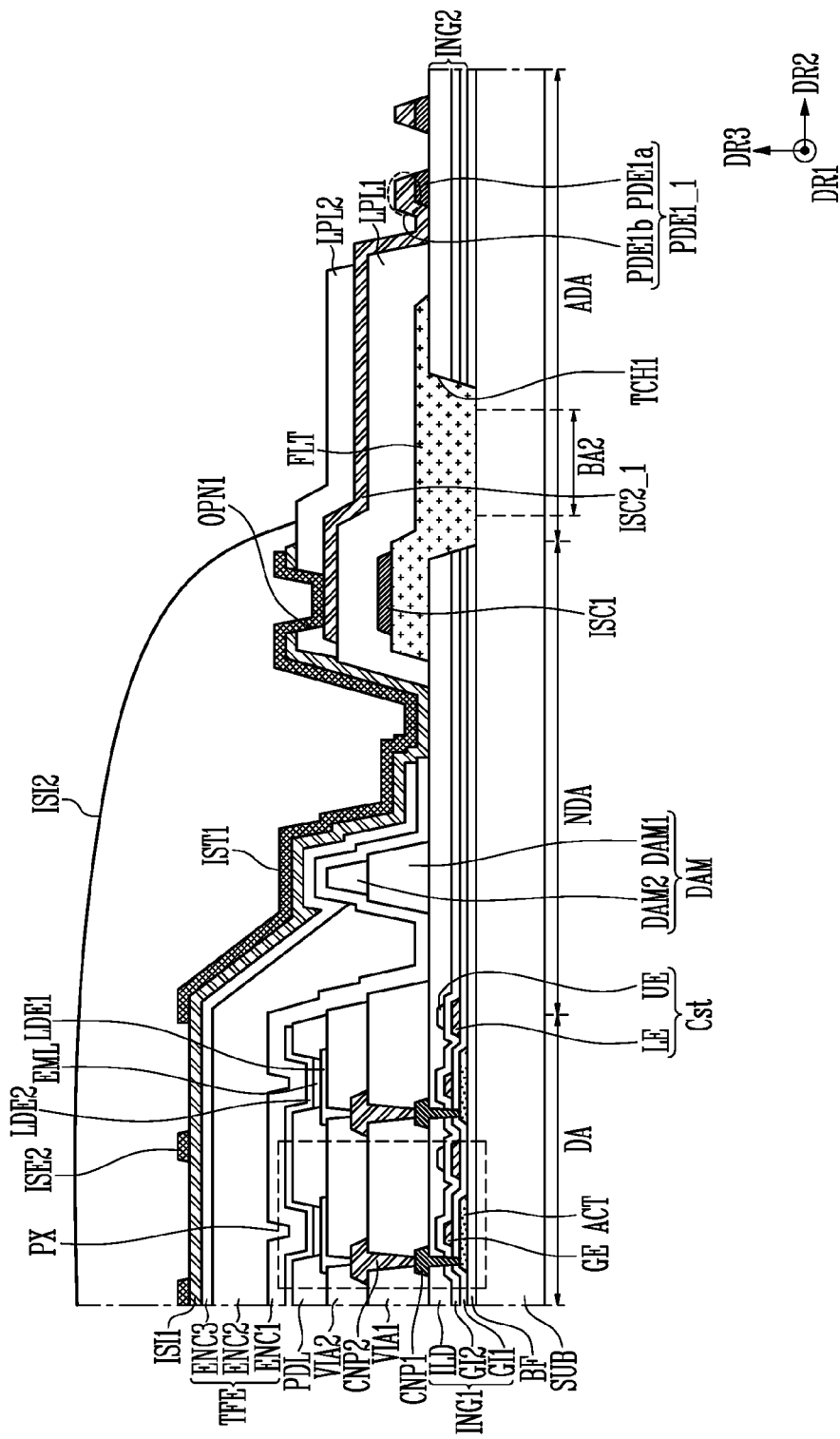
FIG. 4 is a modified version of the cross-sectional view of FIG. 3 according to an exemplary embodiment.

FIG. 3 is a cross-sectional view taken along sectional line I1-I1' of FIG. 2 according to an exemplary embodiment. FIG. 4 is a modified version of the cross-sectional view of FIG. 3 according to an exemplary embodiment. It is assumed that the sectional line of FIG. 2 passes through the first pad PDE1, the first connection wire IST1, and the second extension pattern ISC2.

First, the display area DA will be described.

In an exemplary embodiment, pixels PX are provided in the display area DA. Each pixel PX may include a transistor connected to a corresponding wire of the display wires DST, a light emitting element connected to the transistor, and a capacitor Cst. In FIG. 3, for convenience of description, one transistor, one light emitting element, and one capacitor Cst are shown for one pixel PX as an example.

The substrate SUB may be formed of an insulating material, such as glass or resin. In addition, the substrate SUB may be formed of a material having flexibility so as to be bent or folded, and may have a single layer structure or a multilayer structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material configuring the substrate SUB may be variously changed, and may be formed of fiber reinforced plastic ("FRP") or the like.

For example, when the substrate SUB has a multilayer structure, inorganic materials, such as at least one of silicon nitride, silicon oxide, and silicon oxynitride, may be interposed between a plurality of layers in a single layer or a plurality of layers.

A buffer film (or layer) BF may cover the substrate SUB. The buffer film BF may prevent (or mitigate) an impurity from diffusing into a channel of the transistor. The buffer film BF may be an inorganic insulating film formed of an inorganic material. For example, the buffer film BF may be formed of at least one of silicon nitride, silicon oxide, silicon oxynitride and the like, and may be omitted depending on the material and a process condition of the substrate SUB. According to an exemplary embodiment, a barrier layer (not shown) may further be provided, such as on or below the buffer film BF.

An active film ACT may be positioned on the buffer film BF. The active film ACT may be patterned to configure the channel, a source electrode, and a drain electrode of the transistor, or configure a wire. The active film ACT may be formed of a semiconductor material. The active film ACT may be a semiconductor pattern formed of polysilicon, amorphous silicon, oxide semiconductor, or the like. The channel of the transistor is a semiconductor pattern that is not doped with an impurity, and may be an intrinsic semiconductor. The source electrode, the drain electrode, and the wire may be a semiconductor pattern doped with an impurity. As the impurity, an impurity such as an n-type impurity, a p-type impurity, and/or other metals may be used.

A first gate insulating film GI1 may cover the active film ACT. The first gate insulating film GI1 may be an inorganic insulating film formed of an inorganic material. As the inorganic material, an inorganic insulating material such as at least one of polysiloxane, silicon nitride, silicon oxide, and silicon oxynitride may be used.

A gate electrode GE of the transistor and a lower electrode LE of the capacitor Cst may be positioned on the first gate insulating film GI1. The gate electrode GE may overlap an area corresponding to the channel of the active film ACT.

The gate electrode GE and the lower electrode LE may be formed of a metal. For example, the gate electrode GE may be formed of a metal, such as at least one of gold (Au), silver (Ag), aluminum (Al), molybdenum (Mo), chromium (Cr), titanium (Ti), nickel (Ni), neodymium, and copper (Cu), or an alloy of at least one of the aforementioned metals. In addition, the gate electrode GE may be formed of a single film, but is not limited thereto, and may be formed of multiple films in which two or more materials of metals and/or alloys are stacked.

A second gate insulating film GI2 may cover the gate electrode GE and the lower electrode LE. The second gate insulating film GI2 may be an inorganic insulating film formed of an inorganic material. As the inorganic material, at least one of polysiloxane, silicon nitride, silicon oxide, silicon oxynitride, and the like may be used.

An upper electrode UE of the capacitor Cst may be positioned on the second gate insulating film GI2. The upper electrode UE of the capacitor Cst may be formed of a metal. For example, the upper electrode UE may be formed of a metal, such as at least one of gold (Au), silver (Ag), aluminum (Al), molybdenum (Mo), chromium (Cr), titanium (Ti), nickel (Ni), neodymium, and copper (Cu), or an alloy of at least one of the aforementioned metals. In addition, the upper electrode UE may be formed of a single film, but is not limited thereto, and may be formed of multiple films in which two or more materials of metals and/or alloys are stacked.

The lower electrode LE and the upper electrode UE may configure the capacitor Cst with the second gate insulating film GI2 interposed therebetween. In FIG. 3, the capacitor Cst is shown as a two layer electrode structure of the lower electrode LE and the upper electrode UE. However, in some exemplary embodiments, the capacitor Cst may be configured as a three layer electrode structure using the active film ACT, a three layer electrode structure using an electrode of the same layer as a first connection pattern CNP1, or an electrode structure of four or more layers.

An interlayer insulating film ILD may cover the upper electrode UE. The interlayer insulating film ILD may be an inorganic insulating film formed of an inorganic material. As the inorganic material, at least one of polysiloxane, silicon nitride, silicon oxide, silicon oxynitride, and the like may be used.

For convenience of description, the first gate insulating film GIL the second gate insulating film GI2, and the interlayer insulating film ILD may be referred to as a first insulating film group ING1. The first insulating film group ING1 may cover a portion of the transistor. According to an exemplary embodiment, the first insulating film group ING1 may further include the buffer film BF.

The first connection pattern CNP1 may be positioned on the interlayer insulating film ILD. The first connection pattern CNP1 may be in contact with each of a source area and a drain area of the active film ACT through a contact hole formed through the interlayer insulating film ILD, the second gate insulating film GI2, and the first gate insulating film Gil.

The first connection pattern CNP1 may be formed of a metal. For example, the source electrode SE and the drain electrode DE may be formed of a metal, such as at least one of gold (Au), silver (Ag), aluminum (Al), molybdenum (Mo), chromium (Cr), titanium (Ti), nickel (Ni), neodymium, and copper (Cu), or an alloy of at least one of the aforementioned metals.

Although not shown, according to an exemplary embodiment, a passivation film may cover the first connection pattern CNP1. The passivation film may be an inorganic insulating film formed of an inorganic material. As the inorganic material, at least one of polysiloxane, silicon nitride, silicon oxide, silicon oxynitride, and the like may be used.

A first via film VIA1 may cover the passivation film or the transistor. The first via film VIA1 may be an organic insulating film formed of an organic material. As the organic material, an organic insulating material, such as at least one of a polyacrylic compound, a polyimide compound, a fluorocarbon compound (such as Teflon), and a benzocyclobutene compound may be used. The organic film may be deposited by a method, such as evaporation; however, any suitable method may be utilized.

A second connection pattern CNP2 may be connected to the first connection pattern CNP1 through an opening portion of the first via film VIAL The second connection pattern CNP2 may be formed of a metal, such as at least one of gold (Au), silver (Ag), aluminum (Al), molybdenum (Mo), chromium (Cr), titanium (Ti), nickel (Ni), neodymium, and copper (Cu), or an alloy of at least one of the aforementioned metals.

A second via film VIA2 may cover the first via film VIA1 and the second connection pattern CNP2. The second via film VIA2 may be an organic insulating film formed of an organic material. As the organic material, an organic insulating material, such as at least one of a polyacrylic compound, a polyimide compound, a fluorocarbon compound (such as Teflon), and a benzocyclobutene compound may be used.

A first light emitting element electrode LDE1 may be connected to the second connection pattern CNP2 through an opening portion of the second via film VIA2. Here, the first light emitting element electrode LDE1 may be an anode of the light emitting element according to an exemplary embodiment. The first light emitting element electrode LDE1 may be electrically connected to the transistor through the first connection pattern CNP1 and the second connection pattern CNP2.

The first light emitting element electrode LDE1 may be formed of a metal film, such as at least one of Ag, Mg, Al, Pt, Pd, Au, Ni, Nd, Ir, Cr, an alloy of at least one of Ag, Mg, Al, Pt, Pd, Au, Ni, Nd, Ir, Cr, indium tin oxide ("ITO"), indium zinc oxide ("IZO"), zinc oxide ("ZnO"), indium tin zinc oxide ("ITZO"), and/or the like. The first light emitting element electrode LDE1 may be formed of one kind of metal, but is not limited thereto, and may be formed of two or more kinds of metals, for example, an alloy of Ag and Mg.

The first light emitting element electrode LDE1 may be formed of a transparent conductive film when an image is to be provided in a downward direction of the substrate SUB, e.g. in a direction toward the substrate SUB, and the first light emitting element electrode LDE1 may be formed of a metal reflective film and/or a transparent conductive film when an image is to be provided in an upward direction of the substrate SUB, e.g., in direction away from the substrate SUB.

A pixel definition film PDL for partitioning a light emitting area of each pixel PX is provided on the substrate SUB on which the first light emitting element electrode LDE1 and the like are formed. The pixel definition film PDL may be an organic insulating layer formed of an organic material. As the organic material, an organic insulating material, such as at least one of a polyacrylic compound, a polyimide compound, a fluorocarbon compound (such as Teflon), and a benzocyclobutene compound may be used.

The pixel definition film PDL may expose an upper surface of the first light emitting element electrode LDE1 and may be protruded from the substrate SUB along a periphery of the pixel PX. A light emitting film EML may be provided in an area of the pixel PX surrounded by the pixel definition film PDL.

The light emitting film EML may include a low molecular material or a high molecular material. Examples of the low molecular material may include at least one of copper phthalocyanine (CuPc), N, N-di (naphthalen-1-yl)-N, N'-diphenyl-benzidine (N, N'-Di(naphthalene-1-yl)-N, N'-diphenyl-benzidine (NPB), tris-8-hydroxyquinoline aluminum (Alq3), and the like. These materials may be formed by a vacuum deposition method, but any other suitable method may be utilized. Examples of the high molecular material may include at least one of poly(3,4-ethylenedioxythiophene) (PEDOT), poly(p-phenylene vinylene) ("PPV"), polyfluorene, and the like.

The light emitting film EML may be provided as a single layer, but may be provided as multiple layers including various functional layers. When the light emitting film EML is provided as the multiple layers, the light emitting film EML may have a structure in which a hole injection layer ("HIL"), a hole transport layer ("HTL"), an emission layer ("EML"), an electron transport layer ("ETL"), an electron injection layer ("EIL"), and/or the like are stacked in a single or composite structure. The light emitting film EML may be formed by at least one of a screen printing method, an inkjet printing method, a laser induced thermal imaging ("LITI") method, and the like.

According to an exemplary embodiment, at least a portion of the light emitting film EML may be integrally formed over a plurality of first light emitting element electrodes LDE1, and may also be individually provided to correspond to the plurality of first light emitting element electrodes LDE1, respectively.

A second light emitting element electrode LDE2 may be provided on the light emitting film EML. The second light emitting element electrode LDE2 may be provided for each pixel PX, but may be provided to cover most of the display area DA and may be shared by the plurality of pixels PX.

The second light emitting element electrode LDE2 may be used as a cathode or an anode according to an exemplary embodiment. When the first light emitting element electrode LDE1 is an anode, the second light emitting element electrode LDE2 may be used as a cathode. When the first light emitting element electrode LDE1 is a cathode, the second light emitting element electrode LDE2 may be used as an anode.

The second light emitting element electrode LDE2 may be formed of a metal film, such as at least one of Ag, Mg, Al, Pt, Pd, Au, Ni, Nd, Ir, and Cr, a transparent conductive film, such as at least one of indium tin oxide ("ITO"), indium zinc oxide ("IZO"), zinc oxide ("ZnO"), and indium tin zinc oxide ("ITZO"), and/or the like. In an exemplary embodiment, the second light emitting element electrode LDE2 may be formed of multiple films of two or more films including a metal thin film, and for example, the second light emitting element electrode LDE2 may be formed of a triple film of, for instance, ITO/Ag/ITO.

The second light emitting element electrode LDE2 may be formed of a metal reflective film and/or a transparent conductive film when an image is to be provided in a downward direction of the substrate SUB, and the second light emitting element electrode LDE2 may be formed of a transparent conductive film when an image is to be provided in an upward direction of the substrate SUB.

A set of the first light emitting element electrode LDE1, the light emitting film EML, and the second light emitting element electrode LDE2 may configure the light emitting element, that is, the above-described organic light emitting diode.

The encapsulation film TFE may be provided on the second light emitting element electrode LDE2. The encapsulation film TFE may be formed of a single layer, but may also be formed of multiple layers. As seen in FIG. 3, the encapsulation film TFE may be formed of first to third encapsulation films ENC1, ENC2, and ENC3. The first to third encapsulation films ENC1, ENC2, and ENC3 may be formed of an organic material and/or an inorganic material. The third encapsulation film ENC3 positioned at an outermost periphery may be formed of an inorganic material. For example, the first encapsulation film ENC1 may be an inorganic film configured of an inorganic material, the second encapsulation film ENC2 may be an organic film configured of an organic material, and the third encapsulation film ENC3 may be an inorganic film configured of an inorganic material. Penetration of moisture or oxygen to the inorganic material is less than that of the organic material. However, the inorganic material may be vulnerable to a crack since elasticity or flexibility is low. Propagation of a crack may be prevented (or mitigated) by forming the first encapsulation film ENC1 and the third encapsulation film ENC3 with the inorganic material and forming the second encapsulation film ENC2 with the organic material. Here, a layer formed of the organic material, e.g., the second encapsulation film ENC2, may be completely covered by the third encapsulation film ENC3 so that an end portion is not exposed to the outside. As the organic material, an organic insulating material, such as at least one of a polyacrylic compound, a polyimide compound, a fluorocarbon compound (such as Teflon), and a benzocyclobutene compound may be used. As the inorganic material, at least one of polysiloxane, silicon nitride, silicon oxide, silicon oxynitride, and the like may be used.

The light emitting film EML forming the light emitting element may be easily damaged by moisture or oxygen from the outside. The encapsulation film TFE protects the light emitting elements by covering the light emitting film EML. The encapsulation film TFE may be formed over the entire surface of the display area DA and may extend to the non-display area NDA outside the display area DA. However, in a case of insulating films formed of an organic material, there is an advantage in terms of flexibility and elasticity, but moisture and oxygen may be easily penetrated as compared with an insulating film formed of an inorganic material. In an exemplary embodiment, to prevent (or mitigate) penetration of moisture or oxygen through insulating films formed of an organic material, an end portion of the insulating films formed of the organic material may be covered by insulating films formed of an inorganic material so as not to be exposed to the outside. For example, the first via film VIA1, the second via film VIA2, and the pixel definition film PDL, which are formed of an organic material, do not extend successively to the non-display area NDA, and may be covered by the first encapsulation film ENC1. Therefore, an upper surface of the pixel definition film PDL and sides of the first via film VIA1, the second via film VIA2, and the pixel definition film PDL may be prevented from being exposed to the outside by being encapsulated by the encapsulation film TFE including the inorganic material.

However, whether the encapsulation film TFE is formed of a plurality of layers or a material of the encapsulation film TFE is not limited thereto, and may be variously changed. For example, the encapsulation film TFE may include a plurality of organic material layers and a plurality of inorganic material layers which are alternately stacked.

Figure 6:
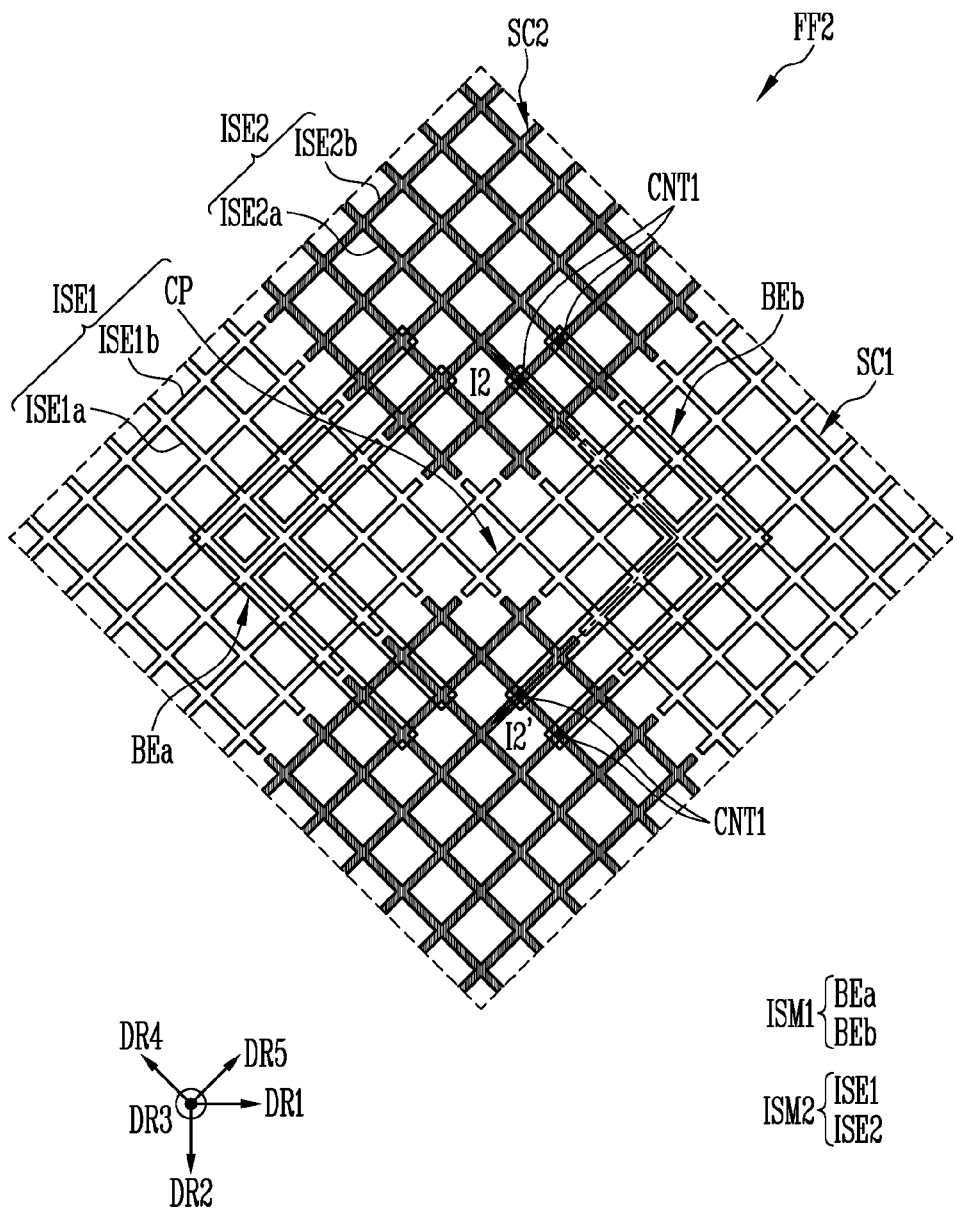
FIG. 6 is a layout diagram illustrating an enlarged view of an area FF2 of FIG. 2 according to an exemplary embodiment.
Figure 7:
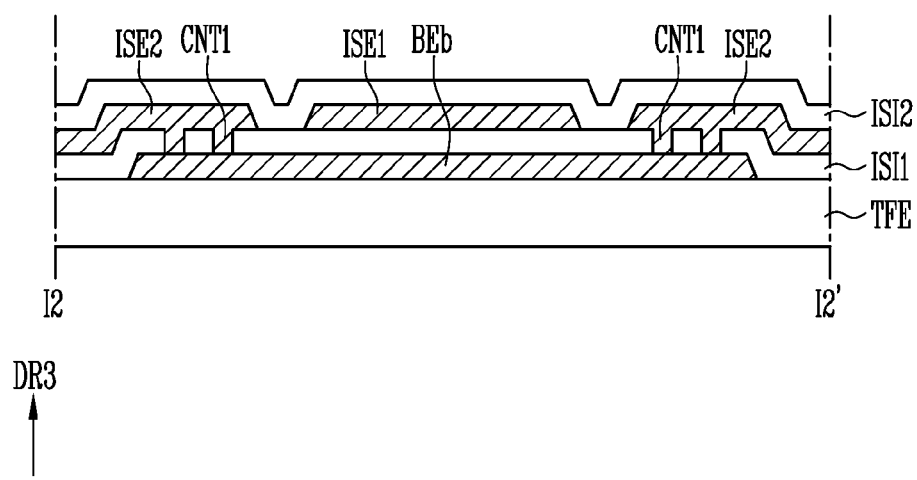
FIG. 7 is a partial cross-sectional view taken along sectional line 12-12' of FIG. 6 according to an exemplary embodiment.

Although not shown in FIG. 3, a first sensing electrode layer ISM1 may be positioned on the encapsulation film TFE. FIGS. 6 and 7 may additionally be referred to for a description of the first sensing electrode layer ISM1 and a second sensing electrode layer ISM2.

According to an exemplary embodiment, an additional buffer film may be positioned between the first sensing electrode layer ISM1 and the encapsulation film TFE. The first sensing electrode layer ISM1 may be formed of a metal film, such as at least one of Ag, Mg, Al, Pt, Pd, Au, Ni, Nd, Ir, and Cr, a transparent conductive film, such as at least one of indium tin oxide ("ITO"), indium zinc oxide ("IZO"), zinc oxide ("ZnO"), indium tin zinc oxide ("ITZO"), and/or the like.

The first sensing insulating film ISI1 may be present on the first sensing electrode layer IMS1. The first sensing insulating film ISI1 may be an inorganic insulating film formed of an inorganic material. As the inorganic material, an inorganic insulating material such as at least one of polysiloxane, silicon nitride, silicon oxide, silicon oxynitride, and the like may be used.

The second sensing electrode layer ISM2 may be present on the first sensing insulating film ISI1. The second sensing electrode layer ISM2 may be formed of a metal film, such as at least one of Ag, Mg, Al, Pt, Pd, Au, Ni, Nd, Ir, and Cr, a transparent conductive film, such as at least one of indium tin oxide ("ITO"), indium zinc oxide ("IZO"), zinc oxide ("ZnO"), and indium tin zinc oxide ("ITZO"), and/or the like.

Various input sensors may be configured using the first sensing electrode layer ISM1, the first sensing insulating film ISI1, and the second sensing electrode layer ISM2.

As an exemplary embodiment, in the display area DA, the first sensing electrode layer ISM1 and the second sensing electrode layer ISM2 may be disposed so as to overlap the pixel definition film PDL. That is, the first sensing electrode layer ISM1 and the second sensing electrode layer ISM2 may not overlap the anode of the light emitting element.

As an exemplary embodiment, the second sensing electrode layer ISM2 may be patterned to configure the first sensing electrode pattern ISE1 and the second sensing electrode pattern ISE2 in the display area DA and to configure the first connection wire IST1 in the non-display area NDA. The first sensing electrode layer ISM1 may be patterned to form bridge electrodes BEa and BEb in the display area DA.

A second sensing insulating film ISI2 may be positioned on the second sensing electrode layer ISM2. The second sensing insulating film ISI2 may be configured of an organic film. For example, as the organic insulating material, an organic insulating material, such as at least one of a polyacrylic compound, a polyimide compound, a fluorocarbon compound (such as Teflon), and a benzocyclobutene compound may be used. For example, the second sensing insulating film ISI2 may be configured of at least one of poly(methyl methacrylate), polydimethylsiloxane, polyimide, acrylate, polyethylene terephthalate, polyethylene naphthalate, and the like.

Next, the non-display area NDA and the additional area ADA will be described in more detail. Hereinafter, in describing the non-display area NDA and the additional area ADA, the description of the display area DA will be omitted or briefly described in order to avoid repetition of the description.

A dam DAM may be positioned at a boundary of the second encapsulation film ENC2. For example, the dam DAM may be positioned between a planarization film FLT and the second encapsulation film ENC2. The dam DAM may be a multilayer structure and may include, for example, a first dam DAM1 and a second dam DAM2. For example, the first and second dams DAM1 and DAM2 may be formed of an organic material. Each of the first and second dams DAM1 and DAM2 may correspond to any one of the first via film VIA1, the second via film VIA2, and the pixel definition film PDL. For example, when the first dam DAM1 is configured of the same material through the same process as the first via film VIA1, the second dam DAM2 may be configured of the same material through the same process as the second via film VIA2 or the pixel definition film PDL. As another example, when the first dam DAM1 is configured of the same material through the same process as the second via film VIA2, the second dam DAM2 may be configured of the same material through the same process as the pixel definition film PDL. In addition, when a spacer is formed on the pixel definition film PDL of the display area DA, the dam DAM may also be configured using the same material as the spacer.

The dam DAM prevents (or mitigates) the organic material of the second encapsulation film ENC2 of which fluidity is high from overflowing to the outside of the dam DAM during a process. The first and third encapsulation films ENC1 and ENC3 configured of the inorganic material may cover the dam DAM and extend, and thus, adhesion to the substrate SUB or other films on the substrate SUB may be increased.

The first pad PDE1 may be positioned on the substrate SUB, and may be spaced apart from the planarization film FLT. The first pad PDE1 may be supported by a second insulating layer group ING2. Insulating films of the second insulating film group ING2 may correspond to the insulating films of the first insulating film group ING1, respectively. The first pad PDE1 may include a first pad electrode PDE1*a* and a second pad electrode PDE1*b*. As an exemplary embodiment, the first pad electrode PDE1*a* may be configured of the same material as the first connection pattern CNP1. The second pad electrode PDE1*b* may be configured of the same material as the second connection pattern CNP2.

The planarization film FLT may be positioned on the substrate SUB so as to overlap the second bending area BA2, and may be spaced apart from the area covered by the encapsulation film TFE. The planarization film FLT may be an organic insulating film formed of an organic material. As the organic material, an organic insulating material, such as at least one of a polyacrylic compound, a polyimide compound, a fluorocarbon compound (such as Teflon), a benzocyclobutene compound, and the like may be used.

According to some exemplary embodiments, the planarization film FLT may be formed before the formation of the first connection pattern CNP1 after the formation of the interlayer insulating film ILD. Therefore, the planarization film FLT and the first via film VIA1 may be formed through different processes. According to an exemplary embodiment, the planarization film FLT and the first via film VIA1 may include different organic materials.

One end of the planarization film FLT may cover the first insulating film group ING1. In addition, a portion of the planarization film FLT corresponding to the second bending area BA2 may fill a first trench TCH1 between the first insulating film group ING1 and the second insulating film group ING2.

Since the inorganic insulating films have a higher rigidness and a lower flexibility than the organic insulating films, a probability of occurrence of a crack is relatively high. When the crack occurs in the inorganic insulating films, the crack may propagate to wires on the inorganic insulating films, and finally, a defect, such as a wire disconnection, may be generated.

Therefore, as shown in FIG. 3, the first trench TCH1 may be formed by removing the inorganic insulating films from the second bending area BA2, and the first insulating film group ING1 and the second insulating film group ING2 may be distinguished from each other. In some exemplary embodiments, all of the inorganic insulating films corresponding to an area of the first trench TCH1 are removed, but in another exemplary embodiment, some inorganic insulating films may remained. In this case, the remaining inorganic insulating films may include a slit to disperse a bending stress.

As an exemplary embodiment, the extension pattern may directly connect the first pad PDE1 and the first connection wire IST1 to each other. The extension pattern may be a single wire structure or a double wire structure. For instance, the extension pattern may be a double wire structure including a first extension pattern ISC1 and a second extension pattern ISC2 and the second extension pattern ISC2 may directly connect the first pad PDE1 and the first connection wire IST1 to each other as an example.

The first extension pattern ISC1 may be disposed on the planarization film FLT. In some exemplary embodiments, the first extension pattern ISC1 may be configured of the same material through the same process as the first connection pattern CNP1.

A first wire protection film LPL1 may cover the planarization film FLT and the first extension pattern ISC1. In addition, a second wire protection film LPL2 may cover the first wire protection film LPL1.

The first and second wire protection films LPL1 and LPL2 may be formed of an organic material. The first and second wire protection films LPL1 and LPL2 may correspond to any one of the first via film VIA1, the second via film VIA2, and the pixel definition film PDL. For example, when the first wire protection film LPL1 is configured of the same material through the same process as the first via film VIA1, the second wire protection film LPL2 may be configured of the same material through the same process as the second via film VIA2 or the pixel definition film PDL. In another example, when the first wire protection film LPL1 is configured of the same material through the same process as the second via film VIA2, the second wire protection film LPL2 may be configured of the same material through the same process as the pixel definition film PDL.

The second extension pattern ISC2 may be disposed on the first wire protection film LPL1. In some exemplary embodiments, the second extension pattern ISC2 may be configured of the same material through the same process as the second connection pattern CNP2. The second extension pattern ISC2 may be formed to extend in the second direction DR2 and be directly connected to the first pad PDE1. As an exemplary embodiment, an end portion of the second extension pattern ISC2 may be the second pad electrode PED1$b$, may be in contact with the first pad electrode PED1$a$, and may configure the first pad PDE1 together with the first pad electrode PDE1. The second extension pattern ISC2 may traverse the second bending area BA2. The second extension pattern ISC2 may be formed over the additional area ADA including the non-display area NDA and the second bending area BA2.

As an exemplary embodiment, the second extension pattern ISC2 may be connected to the first extension pattern ISC1 through a portion (for example, a second opening portion OPN2) of the first wire protection layer LPL1. The second extension pattern ISC2 may reduce a resistance through the connection with the first extension pattern ISC1. However, the first extension pattern ISC1 and the second extension pattern ISC2_1 may not be connected to each other, as in the modified version of FIG. 4.

The second wire protection film LPL2 may be disposed on the second extension pattern ISC2 and the first wire protection film LPL1. The first sensing insulating film ISI1 may be formed over at least a portion on the second wire protection film LPL2.

The second wire protection film LPL2 and the first sensing insulating film ISI1 may include a first opening portion OPN1 exposing at least a portion of the second extension pattern ISC2. The first connection wire IST1 may be directly connected to the second extension pattern ISC2 through the first opening portion OPN1.

According to some exemplary embodiments, a height of the second extension pattern ISC2 positioned on the first insulation film group ING1 may be greater than a height of the second extension pattern ISC2 positioned on the second insulation film group ING2.

Therefore, for example, the second extension pattern ISC2 may be directly connected to the first pad PDE1 without another bridge wire formed in the same layer as the gate electrode GE. Since there is not another bridge wire, electrical connection reliability between the first connection wire IST1 and the first pad PDE1 is improved. In addition, since a length of the additional area ADA may be reduced by a length of the bridge wire, a dead space may be reduced and implementation of a thinner (and/or smaller) bezel may be easy.

Figure 5:
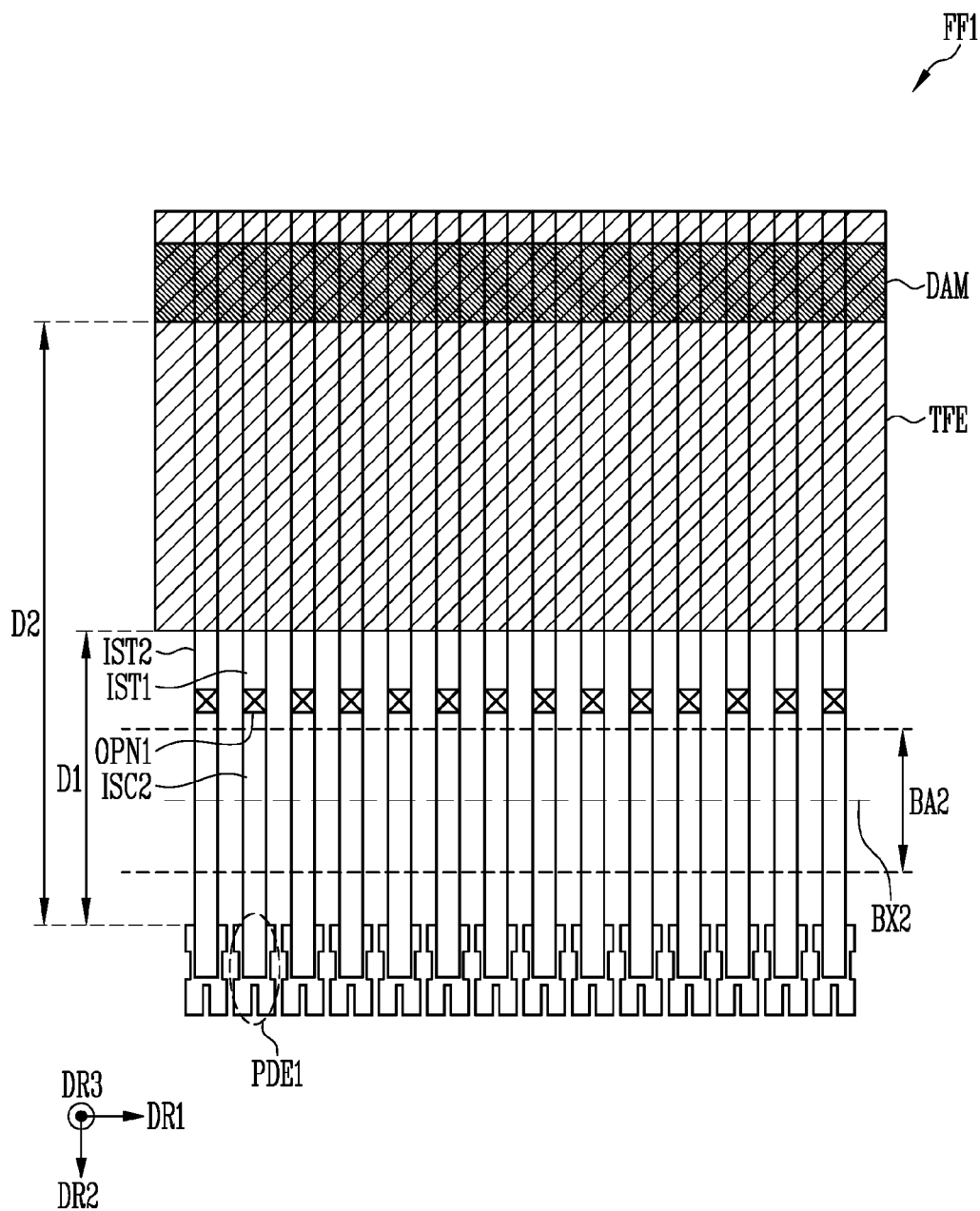
FIG. 5 is an enlarged plan view of an area FF1 of FIG. 2 according to an exemplary embodiment.

FIG. 5 is an enlarged plan view of an area FF1 of FIG. 2 according to an exemplary embodiment. In FIG. 5, planar positions of the dam DAM, the encapsulation film TFE, the first connection wire IST1, the second connection wire IST2, the second extension pattern ISC2, and the first pad PDE1 are schematically shown.

As an exemplary embodiment, the second extension pattern ISC2 may directly connect the first connection wire IST1 and the first pad PDE1 without another bridge, and thus, a distance D1 between a boundary of the encapsulation film TFE and the first pad PDE1 may be less than 200 μm. In addition, a distance D2 between the dam DAM and the first pad PDE1 may be less than 515 μm.

Next, the sensing electrode patterns ISE1 and ISE2 positioned on the encapsulation film TFE will be described with reference to FIGS. 6 and 7.

FIG. 6 is a layout diagram illustrating an enlarged view of an area FF2 of FIG. 2 according to an exemplary embodiment. FIG. 7 is a partial cross-sectional view taken along sectional line 12-12' of FIG. 6 according to an exemplary embodiment. FIG. 7 shows only a portion corresponding to the encapsulation film TFE to the second sensing insulating film ISI2.

As an exemplary embodiment, the sensing electrodes SC1 and SC2 may be formed of each of sensing electrode patterns ISE1 and ISE2 of a mesh shape. Each of the sensing electrode patterns ISE1 and ISE2 may include first sub-sensing electrode patterns ISE1a and ISE2a extending in a fourth direction DR4 and second sub-sensing electrode patterns ISE1b and ISE2b extending in a fifth direction DR5 intersecting the fourth direction DR4. The fourth direction DR4 and the fifth direction DR5 are inclined directions, which are directions different from the first direction DR1 and the second direction DR2.

However, the sensing electrodes SC1 and SC2 are not limited to the illustrated shape. In another exemplary embodiment, the sensing electrodes SC1 and SC2 may be plate-shaped electrodes of a rhombus shape, and in this case, the sensing electrodes SC1 and SC2 may be a transparent metal material. It is noted, however, that other shapes may be utilized.

A light emitting area defined by the pixel PX and the pixel definition layer PDL may be disposed so as to overlap a mesh hole formed by each of the sensing electrode patterns ISE1 and ISE2. The first sensing electrode pattern ISE1 and the second sensing electrode pattern ISE2 may be spaced apart from each other and insulated from each other.

Adjacent first sensing electrode patterns ISE1 may extend in the first direction DR1. Two adjacent first sensing electrode patterns ISE1 may be physically connected to each other through a connection portion CP.

Adjacent second sensing electrode patterns ISE2 may be disposed to be spaced apart from each other in the second direction DR2. The second sensing electrode patterns ISE2 may be electrically connected to each other through at least one bridge electrode BEa and BEb. The connection portion CP of the first sensing electrode pattern ISE1 may be disposed between the spaced apart second sensing electrode patterns ISE2.

As an exemplary embodiment, the bridge electrodes BEa and BEb may be formed in the first sensing electrode layer ISM1. The first sensing insulating layer ISI1 may include a contact hole CNT1 exposing the bridge electrodes BEa and BEb. Each of the sensing electrode patterns ISE1 and ISE2 may be formed in the second sensing electrode layer ISM2. The second sensing electrode pattern ISE2 may be connected to the bridge electrodes BEa and BEb through the contact hole CNT1.

However, a stack structure of the sensing electrode patterns ISE1 and ISE2 and the bridge electrodes BEa and BEb is not limited thereto. In another exemplary embodiment, the bridge electrodes BEa and BEb may be formed in the second sensing electrode layer ISM2 and each of the sensing electrode patterns ISE1 and ISE2 may be formed in the first sensing electrode layer ISM1.

Next, a display device according to another exemplary embodiment will be described, centering on a cross-section passing through the first pad PDE1 and the first connection wire IST1. Hereinafter, a description of the same elements as those in FIGS. 1 to 7 will be omitted, and the same or similar reference numerals are used for the same elements as those in FIGS. 1 to 7.

Figure 8:
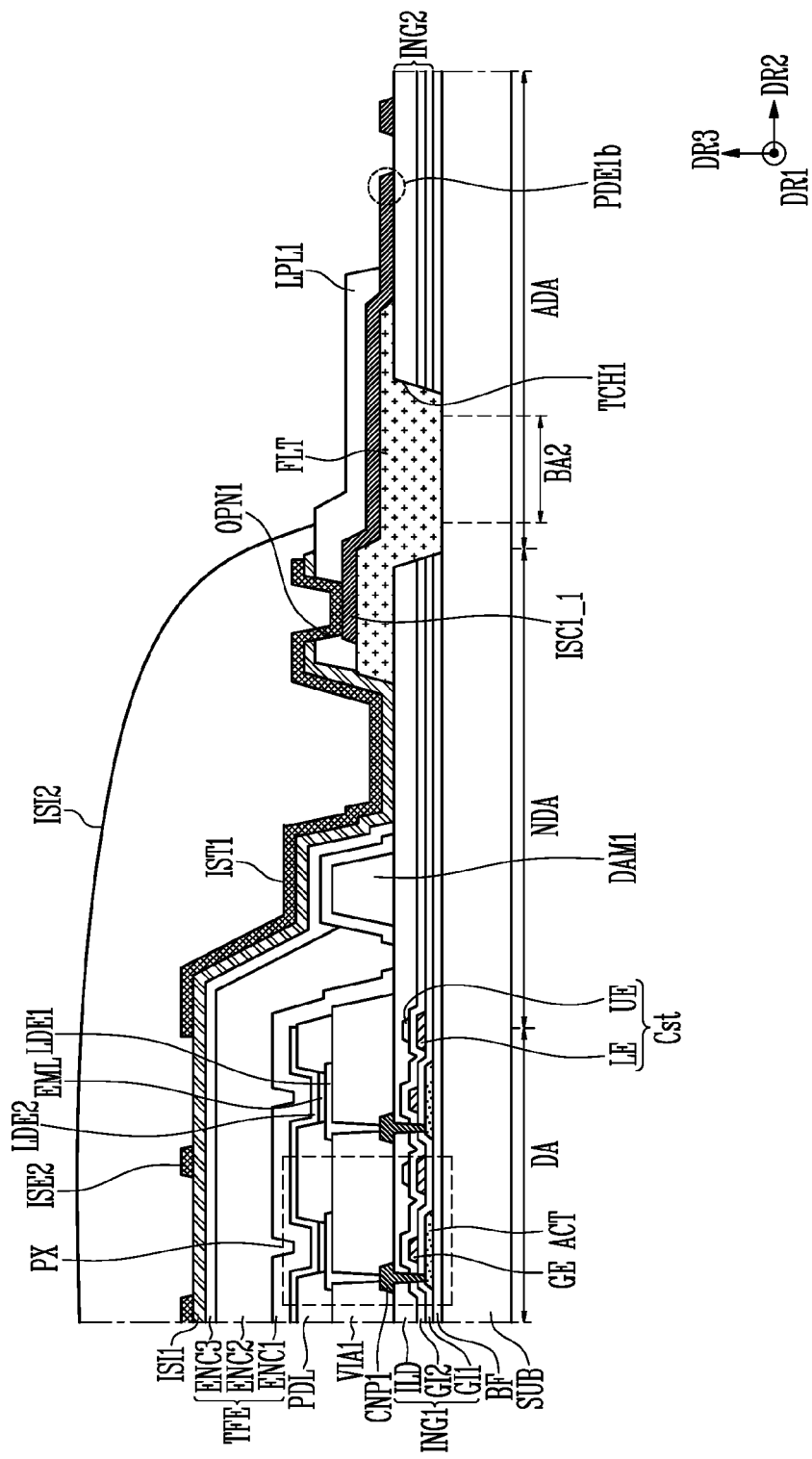
FIG. 8 is a cross-sectional view of a display device according to an exemplary embodiment.

FIG. 8 is a cross-sectional view of a display device according to an exemplary embodiment.

Referring to FIG. 8, the display device is different from the exemplary embodiments described in association with FIG. 3 in that the second via film VIA2, the second connection pattern CNP2, the second wire protection film LPL2, and the second extension pattern ISC2 are omitted.

As an exemplary embodiment, the first light emitting element electrode LDE1 may be directly connected to a first connection pattern CNP1 through the opening portion of the first via film VIA1.

As an exemplary embodiment, the first connection wire IST1 may be connected to the first extension pattern ISC1_1 through a portion of the first wire protection film LPL1. For example, the first wire protection film LPL1 may include a first opening portion OPN1 exposing the first extension pattern ISC1_1. The first extension pattern ISC1_1 may be connected to the first connection wire IST1 through the first opening portion OPN1. According to some exemplary embodiments, a height of the first extension pattern ISC1_1 positioned on the first insulating layer group ING1 may be greater than a height of the first extension pattern ISC1_1 positioned on the second insulating layer group ING2.

The first extension pattern ISC1_1 may extend in the second direction DR2 and traverse the second bending area BA2, and may be formed so as to be directly in contact with the first pad PDE1 or an end portion may configure the second pad electrode PDE1b of the first pad PDE1 as shown in the figure.

Figure 9:
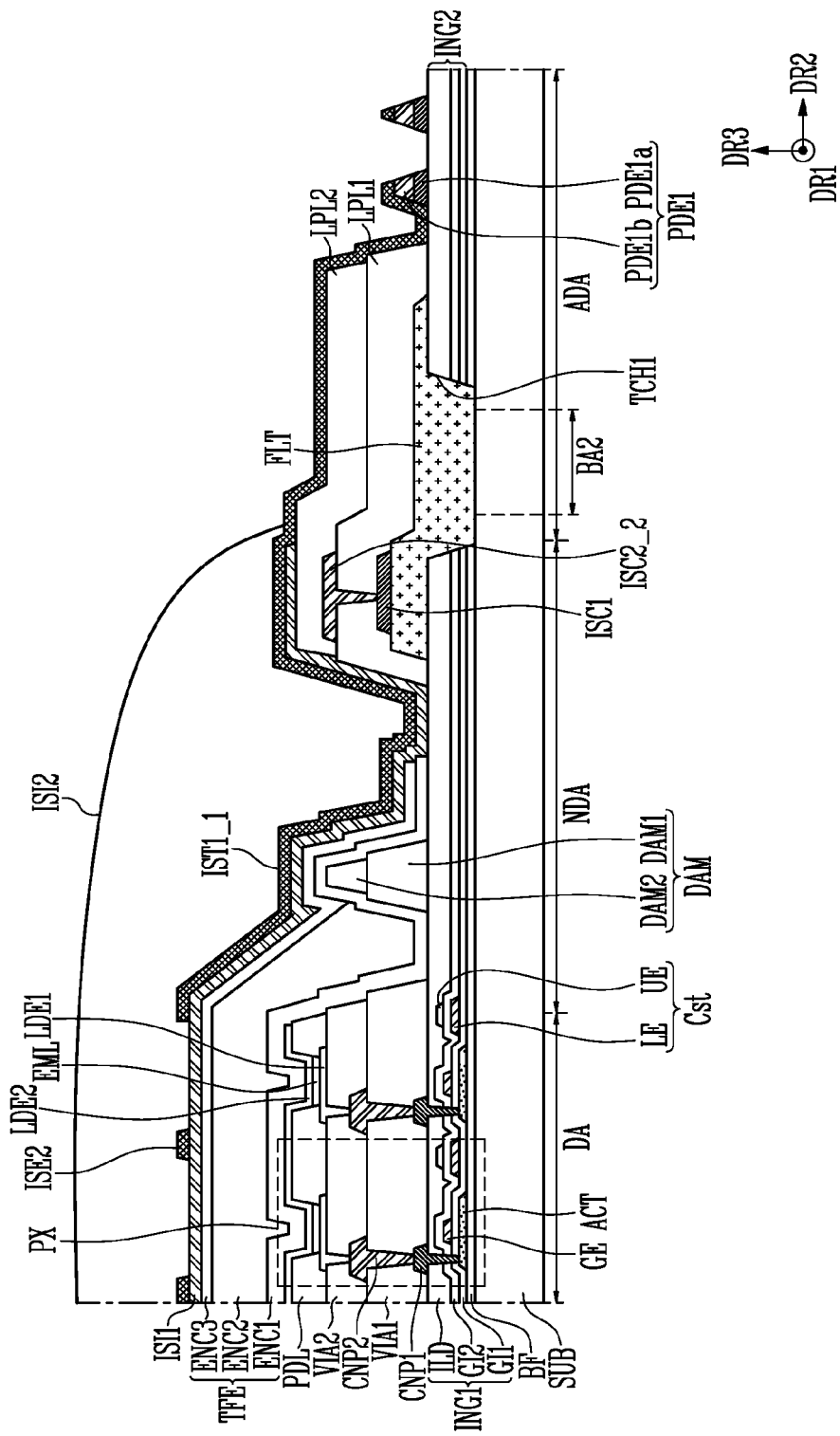
FIGS. 9 and 10 are cross-sectional views of a display device according to various exemplary embodiments.
Figure 10:
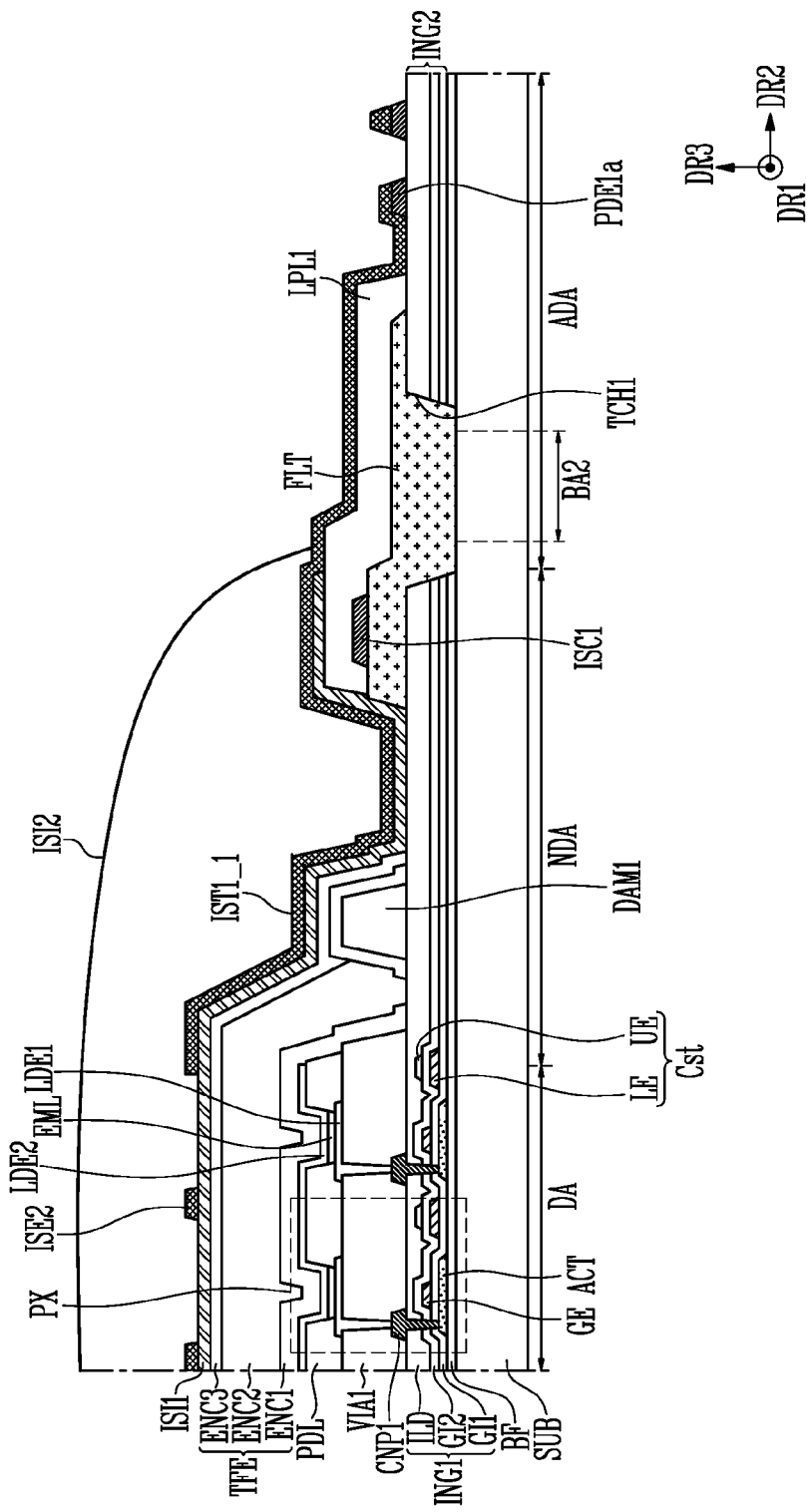

FIGS. 9 and 10 are cross-sectional views of a display device according to various exemplary embodiments.

Referring to FIG. 9, the display device is different from the exemplary embodiments described in association with FIG. 3 in that the first connection wire IST1_1 is directly contact with the first pad PDE1.

Although FIG. 9 shows that the first connection wire IST1_1 is not electrically connected to the second extension pattern ISC2_2 and the first extension pattern ISC1, exemplary embodiments are not limited thereto. In another exemplary embodiment, a resistance of the first connection wire IST1_1 may be reduced by electrically connecting the first connection wire IST1_1 to the second extension pattern ISC2_2 and/or the first extension pattern ISC1.

As an exemplary embodiment, the first connection wire IST1_1 may extend on the wire protection films LPL1 and LPL2 in the second direction DR2 and traverse the second bending area BA2 and may be directly in contact with the first pad PDE1.

Since the first connection wire IST1_1 is directly connected to the first pad PDE1 without another bridge wire, connection reliability between the first connection wire IST1_1 and the first pad PDE1 may be improved and the length of the additional area ADA may be reduced.

Referring to FIG. 10, the display device is different from the exemplary embodiments described in association with FIG. 9 in that the second via film VIA2, the second connection pattern CNP2, the second wire protection film LPL2, and the second extension pattern ISC2_2 may be omitted.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
   a substrate comprising a display area, a non-display area outside the display area, an additional area at a side of the non-display area, and a bending area defined in at least a portion of the additional area;

a pixel on the display area;
an encapsulation film on the pixel;
a sensing electrode on the encapsulation film;
a pad on the additional area;
a connection wire on the non-display area and directly connected to the sensing electrode;
an extension pattern directly connecting the pad and the connection wire to each other; and
a first wire protection film that, in a direction perpendicular to the substrate, is between the connection wire and the extension pattern,
wherein:
the extension pattern traverses the bending area;
a plurality of inorganic insulating films is disposed between the substrate and the pixel;
the pixel and the pad are disposed on the plurality of inorganic insulating films;
a planarization film formed of an organic material is disposed on the bending area from which the plurality of inorganic insulating films is removed;
the first wire protection film is on a second extension pattern;
the first wire protection film comprises a first opening portion exposing at least a portion of the second extension pattern; and
the connection wire is directly connected to the second extension pattern through the first opening portion.

2. The display device of claim 1, wherein:
the encapsulation film overlaps an entire surface of the display area and extends to the non-display area; and
a distance between a boundary of the encapsulation film and the pad is greater than or equal to 0 μm and less than 200 μm.

3. The display device of claim 1, wherein the extension pattern is on the non-display area and the additional area.

4. The display device of claim 1, wherein:
the pixel further comprises a light emitting element electrically connected to the transistor;
the display device further comprises a connection pattern that electrically connects an active film of the transistor and an anode of the light emitting element; and
the connection pattern and the extension pattern are formed in a same layer.

5. The display device of claim 4, wherein the extension pattern is in a layer different from a gate electrode of the transistor.

6. The display device of claim 4, wherein:
the connection pattern comprises a first connection pattern and a second connection pattern disposed in different layers; and
the extension pattern is formed in a same layer as the second connection pattern.

7. The display device of claim 6, wherein:
the pad comprises a first pad electrode and a second pad electrode;
the first pad electrode is a same material as the first connection pattern; and
the second pad electrode is a same material as the second connection pattern.

8. The display device of claim 7, wherein the second pad electrode forms an end portion of the extension pattern.

9. The display device of claim 4, further comprising:
a via film between the connection pattern and the light emitting element; and
a dam on the non-display area and formed of a same material as the via film.

10. The display device of claim 9, wherein:
the encapsulation film comprises an organic film; and
the dam is at a boundary of the organic film.

11. The display device of claim 9, wherein a distance between the dam and the pad is greater than or equal to 0 μm and less than 515 μm.

12. The display device of claim 1, wherein the extension pattern is on the planarization film.

13. The display device of claim 12, wherein, in a plan view, the pad is spaced apart from the planarization film.

14. The display device of claim 12, wherein:
the extension pattern comprises a first extension pattern on the planarization film and the second extension pattern on the first extension pattern; and
the second extension pattern directly connects the pad and the connection wire to each other.

15. The display device of claim 14, further comprising:
a second wire protection film on the first extension pattern and formed of an organic material,
wherein the first wire protection film is formed of an organic material.

16. The display device of claim 15, wherein the second extension pattern is connected to the first extension pattern through a second opening portion penetrating the second wire protection film.

17. The display device of claim 1, wherein:
the sensing electrode comprises electrode patterns of a mesh shape; and
the pixel is disposed in a hole of the mesh shape formed by the electrode patterns.

18. The display device of claim 1, further comprising:
a bridge electrode on the encapsulation film; and
a sensing insulating film on the bridge electrode and comprising a contact hole exposing at least a portion of the bridge electrode,
wherein the sensing electrode is on the sensing insulating film and is connected to the bridge electrode through the contact hole.

19. The display device of claim 18, wherein the sensing electrode and the connection wire are formed in a same layer.

20. A display device comprising:
a substrate comprising a display area, a non-display area outside the display area, an additional area on a side of the non-display area, and a bending area in at least a portion of the additional area;
a transistor on the display area;
a light emitting element comprising an anode electrically connected to the transistor;
an encapsulation film covering the light emitting element;
a sensing electrode on the encapsulation film;
a pad on the additional area; and
a connection wire on the non-display area and directly connected to the sensing electrode without a contact hole,
wherein:
the connection wire is directly connected to the pad without a contact hole, the connection wire overlapping the non-display area and the bending area;
a plurality of inorganic insulating films is disposed between the substrate and the light emitting element;
the light emitting element and the pad are disposed on the plurality of inorganic insulating films; and
a planarization film formed of an organic material is disposed on the bending area from which the plurality of inorganic insulating films is removed.

* * * * *